(12) United States Patent
Koski

(10) Patent No.: US 7,768,757 B2
(45) Date of Patent: Aug. 3, 2010

(54) CIRCUIT DIAGNOSTICS SWITCH SYSTEM

(75) Inventor: Jack P. Koski, South Lyon, MI (US)

(73) Assignee: GM Global Technology Operations, Inc.

( * ) Notice: Subject to any disclaimer, the term of this patent is extended or adjusted under 35 U.S.C. 154(b) by 857 days.

(21) Appl. No.: 11/402,745

(22) Filed: Apr. 12, 2006

(65) Prior Publication Data

US 2007/0241613 A1    Oct. 18, 2007

(51) Int. Cl.
*H02H 9/02* (2006.01)
(52) U.S. Cl. ...................................................... 361/93.1
(58) Field of Classification Search ............. 361/18, 361/93.1
See application file for complete search history.

(56) References Cited

U.S. PATENT DOCUMENTS

| | | | | |
|---|---|---|---|---|
| 4,918,634 A | * | 4/1990 | Nishimori | 708/142 |
| 5,241,923 A | * | 9/1993 | Janning | 119/721 |
| 5,430,405 A | * | 7/1995 | Cohen | 327/581 |
| 6,229,383 B1 | * | 5/2001 | Ooishi | 327/540 |

* cited by examiner

*Primary Examiner*—Jared J Fureman
*Assistant Examiner*—Nicholas Ieva

(57) ABSTRACT

A switch system comprising a detection device that operates in first and second modes and that conducts first and second currents based on the first and second modes, respectively. A control module input circuit outputs first and second voltages based on the first and second currents. The switch system further includes a control module that receives the first and second voltages and that compares the first and second voltages to first and second predetermined voltage ranges, respectively. Further, the control module detects at least one of a proper operation and a faulty operation of the switch system based on the comparison. The control module receives the first voltage when the detection device conducts the first current and receives the second voltage when the detection device conducts the second current.

18 Claims, 17 Drawing Sheets

CIRCUIT DIAGNOSTICS SWITCH SYSTEM

FIELD OF THE INVENTION

The present invention relates to vehicle diagnostic systems, and more particularly to a switch system for detecting faults in an electrical circuit.

BACKGROUND OF THE INVENTION

Single throw switches can be used in vehicles to detect the presence of an input, such as fluid pressure. A single throw switch typically provides a single circuit connection. Single throw switches can be utilized in circuits to create an open circuit when a desired input is not detected and a closed circuit when the desired input is detected. Accordingly, a single throw switch in a closed circuit position having an open circuit fault may not be distinguishable from a single throw switch in an open circuit position. Therefore, it may be difficult to detect circuit faults in circuits utilizing single throw switches.

SUMMARY OF THE INVENTION

A switch system comprising a detection device that operates in first and second modes and that conducts first and second currents based on the first and second modes, respectively. A control module input circuit outputs first and second voltages based on the first and second currents. The switch system further includes a control module that receives the first and second voltages and that compares the first and second voltages to first and second predetermined voltage ranges, respectively. Further, the control module detects at least one of a proper operation and a faulty operation of the switch system based on the comparison. The control module receives the first voltage when the detection device conducts the first current and receives the second voltage when the detection device conducts the second current.

In other features, the control module receives a third voltage when the control module input circuit has a first electrical fault. The control module receives a fourth voltage when the control module input circuit has a second electrical fault. The control module receives a fifth voltage when the control module input circuit has a third electrical fault.

In yet another feature, proper operation includes detecting one of the first and second modes.

In still another feature, faulty operation includes detecting at least one of the first, second and third electrical faults.

In still other features, the control module detects the first mode when the first voltage is within a first predetermined voltage range. The control module detects the second mode when the second voltage is within a second predetermined voltage range.

In yet other features, the control module detects the first electrical fault when the third voltage is within a third predetermined voltage range. The control module detects the second electrical fault when the fourth voltage is within a fourth predetermined voltage range. The control module detects the third electrical fault when the fifth voltage is within a fifth predetermined voltage range.

In still other features, the detection device is a double throw switch including two resistances having ends that communicate with the control module input circuit and having an opposite ends selectable by the double throw switch based on the first and second modes. The first mode selects the first resistance and the second mode selects the second resistance.

In still other features, the detection device is a Hall-effect switch having a Hall-effect device that communicates with the control module input circuit. The Hall-effect switch conducts a current having a first strength based on the first mode and conducts the current having a second strength based on the second mode. The first mode conducts the first current having the first strength and the second mode conducts the current having the second strength.

In yet other features, the control module determines the Hall-effect switch is in the first mode when the first voltage is within a first predetermined voltage range. The control module determines the Hall-effect switch is in the second mode when the second voltage is within a second predetermined voltage range.

In still other features, the input circuit includes an analog-to-digital (A/D) converter having an input and that outputs the voltage to the control module. A voltage, stabilizing device has an end that communicates with a voltage source and has an opposite end that communicates with the input of the A/D converter. A first resistance has an end that communicates with a ground source and has an opposite end that communicates with the input of the A/D converter. A second resistance has an end that communicates with the input of the A/D converter and has an opposite end that communicates with the detection device.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
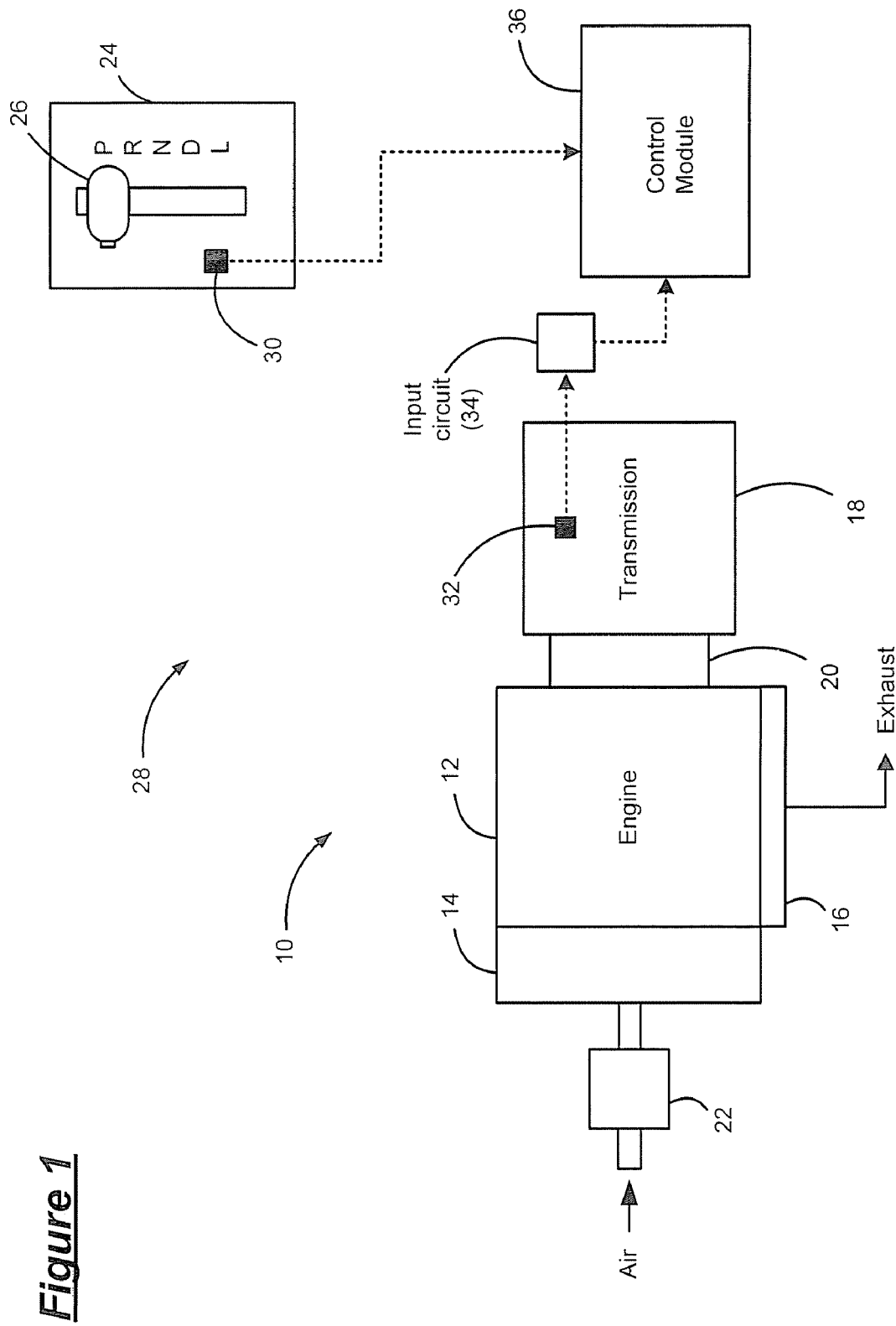
FIG. 1 is a block diagram of an exemplary engine system having a switch system according to the present invention.

The following description of the preferred embodiment is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit and/or other suitable components that provide the described functionality.

Referring now to FIG. 1, an exemplary engine system 10 utilizing a switch system according to the present teachings is illustrated. The engine system 10 includes an engine 12, an intake manifold 14, an exhaust manifold 16, a transmission 18 and a torque converter 20.

The engine 12 combusts an air and fuel mixture within cylinders (not shown) to drive pistons (not shown) that drive the transmission 18 through the coupling device 20. Air is drawn through a throttle 22 and into the intake manifold 14, which delivers air to the cylinders. Exhaust from the combustion process is exhausted from the cylinders and into the exhaust manifold 16. The exhaust is treated in an exhaust system (not shown) and is released to atmosphere.

A fuel injector (not shown) injects fuel which is combined with the air as it is drawn into the cylinder through an intake port (not shown). The fuel injector can be an injector associated with an electronic or mechanical fuel injection system (not shown), or another system for mixing fuel with intake air. The fuel injector is controlled to provide a desired air/fuel ratio within each cylinder.

A driver input device (DID) 24 enables the driver to select a desired transmission operating mode. More specifically, the DID 24 is illustrated as a PRNDL lever 26 that enables a driver to shift the operating range of the transmission between park (P), reverse (R), neutral (N), drive (D) and low drive (L). The DID 24 can also include tap-shift inputs not shown (i.e., tap-shift up and tap-shift down) that enable a driver to command gear shifts.

The engine system 10 further includes a switch system 28 that detects the presence of fluid used to operate the transmission. Information from the switch system 28 is used to determine the transmission operating mode. Additionally, the switch system 28 can detect electrical faults that may exist in therein.

The control system 28 includes a DID sensor 30, a switch 32, a control module input circuit 34 and a control module 36. The DID sensor 30 detects the position of the PRNDL lever 26 and communicates with the control module 36. The switch 32 is typically located in the valve body of the transmission 18 and can be adapted to detect fluid pressure. The switch 32 can operate in two modes to detect the presence of fluid pressure that engages operating ranges of the transmission 18. A first mode exists when no fluid pressure exists. When fluid pressure is detected, the switch operates in a second mode that outputs a pressure signal to the control module input circuit. The switch 32 can utilize metal contacts, or another type of system that conducts current.

The control module input circuit 34 has one end that communicates with the switch 32 and an opposite end that communicates with the control module 36. Although the input circuit 34 is shown to be external from the control module 36, the control module input circuit 34 may be integrated therein. The input circuit 34 outputs a voltage to the control module 36 based on the position of the switch 32 and the electrical state of the input circuit, as discussed in greater detail below. The electrical states include normal conditions and fault conditions. The normal conditions include proper operation of the switch system when the switch 32 operates in the first or second positions and no electrical faults exist. An electrical fault condition includes, but is not limited to, an open circuit between the switch 32 and the control module 36, a short circuit to a ground source and a short circuit to a voltage source.

The control module 36 determines whether normal and/or electrical fault conditions exist based on the voltage output from the input circuit 34. Specifically, the control module 36 is preprogrammed with voltage values that correspond to the normal conditions and the electrical fault conditions. Voltage values are received from the input circuit 34 and are compared to the preprogrammed voltage values. Based on the comparison, the control module 36 can determine whether fluid pressure and/or electrical faults exist.

Referring now to FIGS. 2A-2E, an exemplary switch system 28 includes a control module input circuit 34', a control module 36' and a double throw switch 38. The double throw switch 38 includes a resistor R1 and a resistor R2 that is different from R1. Ends of R1 and R2 communicate with the control module input circuit 34'. Opposite ends of R1 and R2 selectively communicate with a reference potential, such as ground, based on the position of the double throw switch 38. When the double throw switch 38 is in a first mode (POSITION A), R2 communicates with ground and R1 is disconnected. When the double throw switch 38 is in a second mode (POSITION B), R2 is disconnected and R1 communicates with ground.

The control module input circuit 34' includes a resistor network 40, a voltage stabilizing device 42, such as a constant current source, and an analog-to-digital (A/D) converter 44. The resistor network 40 includes resistors R3 and R4. One end of R3 communicates with ground. An opposite end of R3 communicates with an input of the A/D converter 44. One end of R4 communicates with the input of the A/D converter 44. An opposite end of R4 communicates with the double throw switch 38. The voltage stabilizing device 42 has one end that communicates with a voltage source ($V_S$) and has an opposite end that communicates with the input of the A/D converter 44. The resistor network 40 is designed to output different analog voltages when normal conditions and fault conditions exist, as discussed in greater detail below. The A/D converter 44 communicates with the resistor network 40 and the control module 36' and converts analog voltages into digital voltage signals. The control module 36' receives the digital voltage signal and determines a voltage value. The voltage stabilizing device 42 provides a constant voltage to the input circuit and prevents variances in $V_s$ from varying the voltage ($V_{OUT}$) output by the control module input circuit 34'.

Figure 2A:
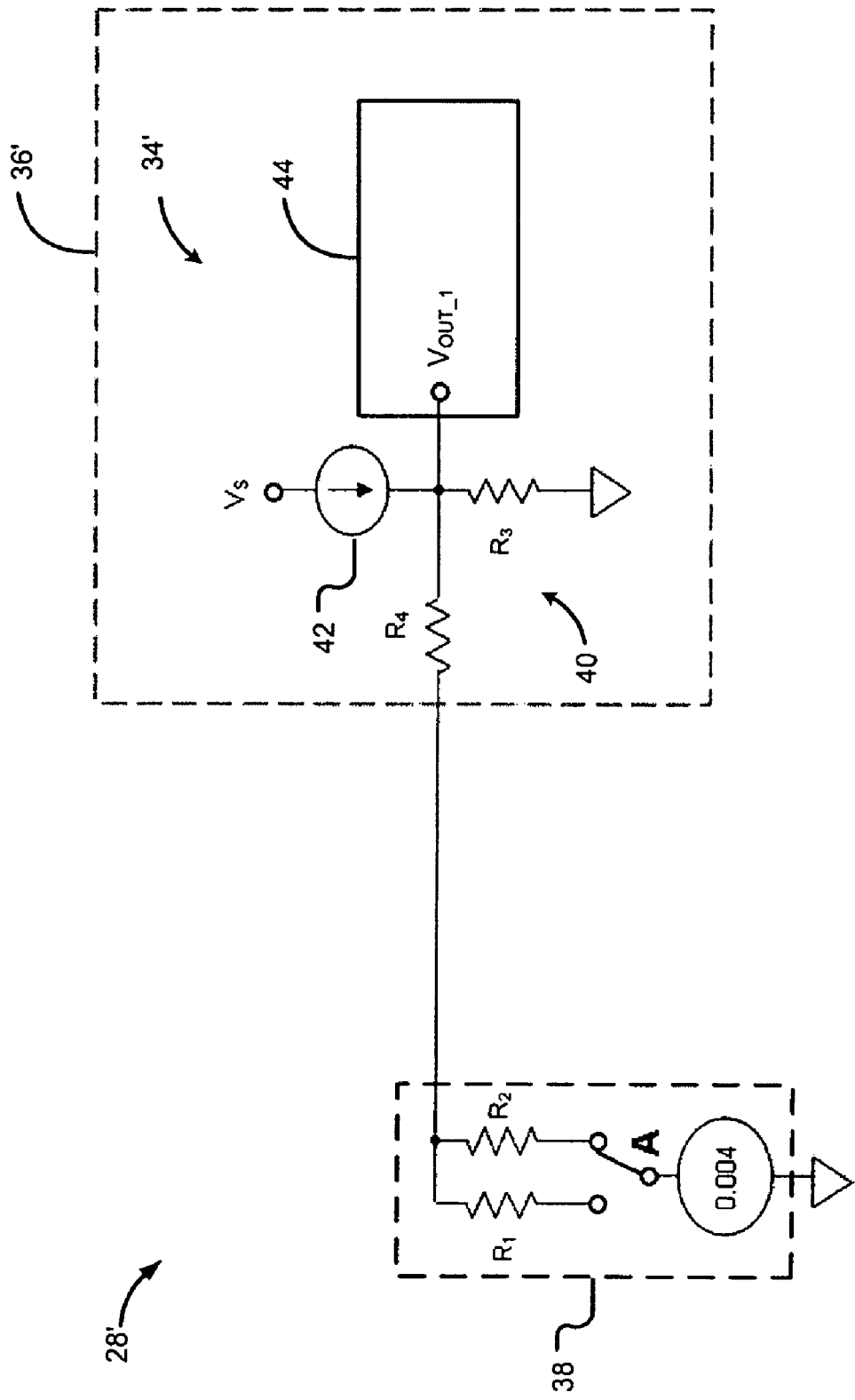
FIGS. 2A, 2B, 2C, 2D and 2E are circuit diagrams of a switch system according to the principles of the present invention.

The control module 36' receives digital voltage signals from the A/D converter 44 based on the position of the double throw switch 38 and the electrical state of the circuit, as discussed in greater detail below. The position of the double throw switch 38 can provide two different current paths. The different current paths can be used to conduct two different currents through the input circuit 34' to produce a different $V_{OUT}$. For example, POSITION A disconnects R1 and connects R2 to ground (FIG. 2A). Accordingly, current is conducted through R3, R4 and R2 and voltage is created across R3, R4 and R2. The combined voltages create $V_{OUT}$, which can be expressed as:

$$V_{out} = \frac{I_C(R_4 + R_2)R_3}{R_2 + R_3 + R_4} \tag{1}$$

Figure 2B:
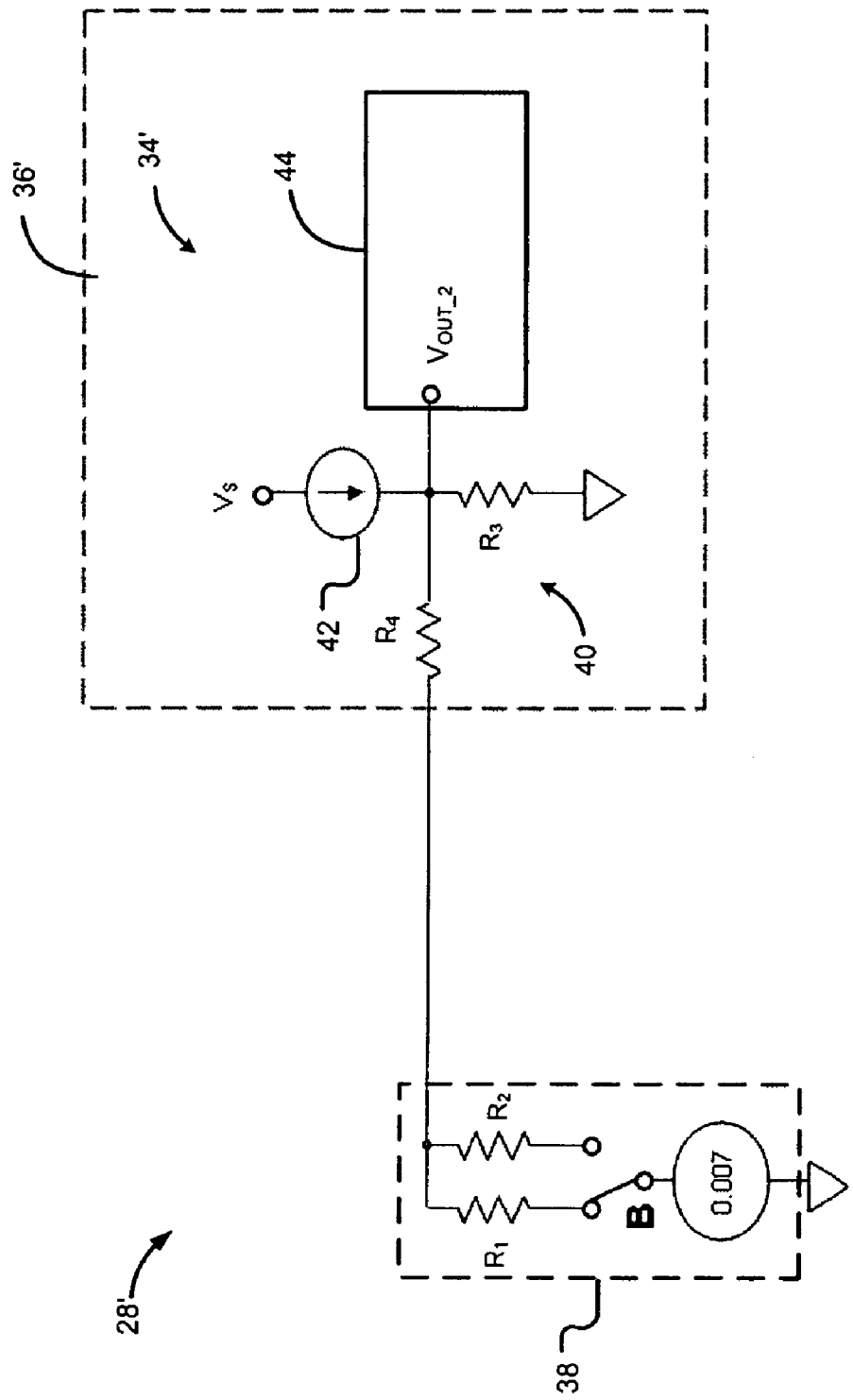
Figure 2C:
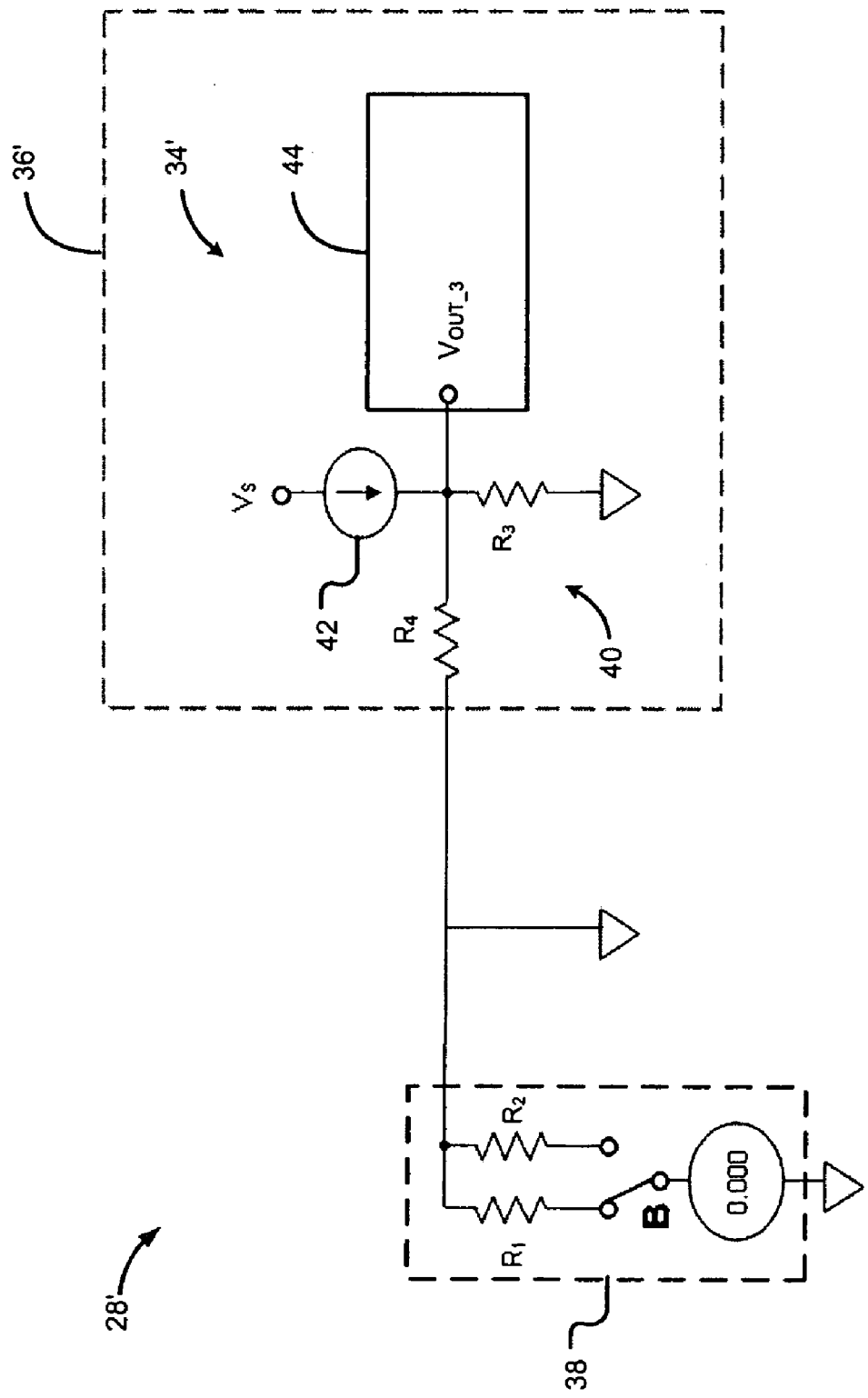
Figure 2D:
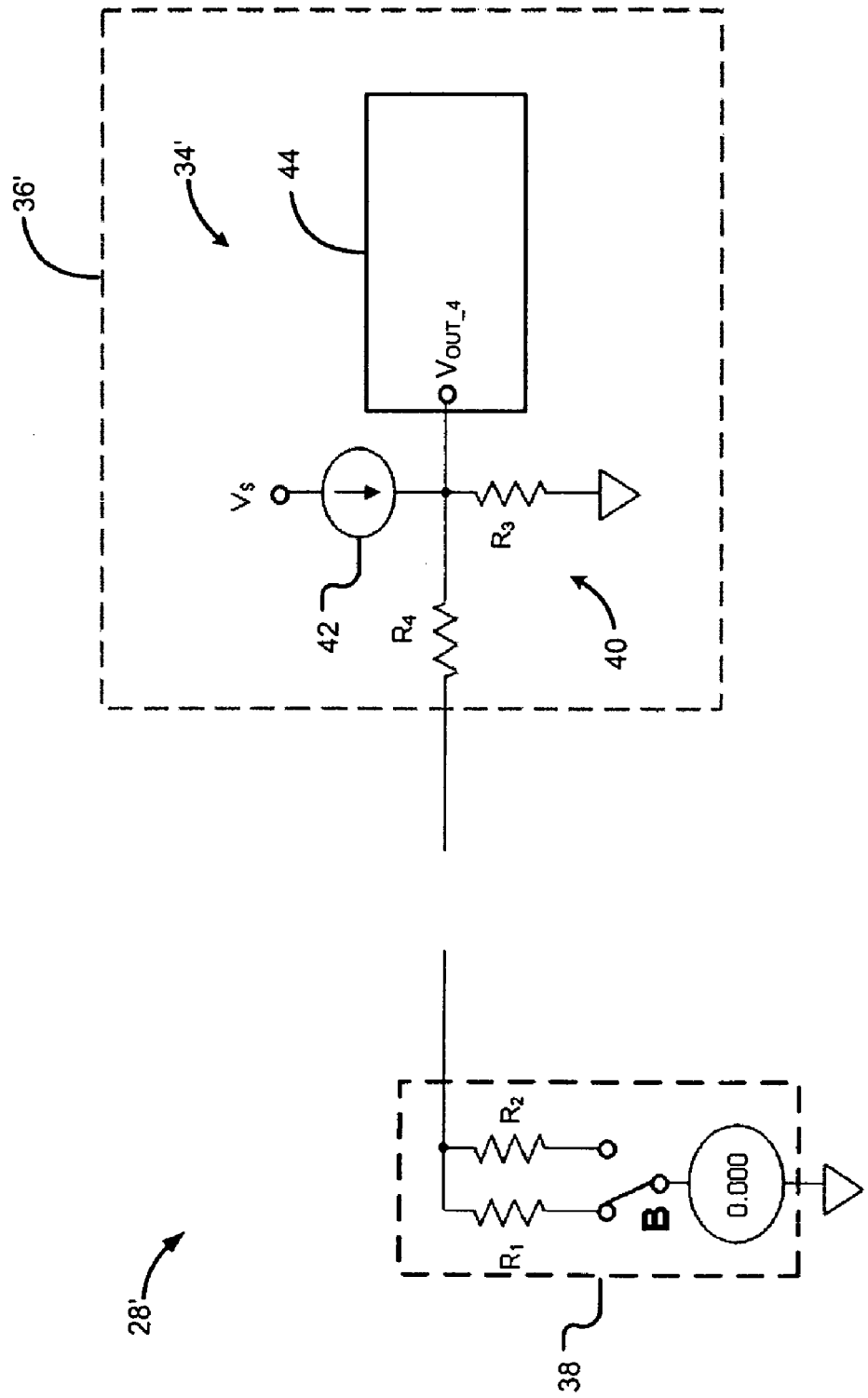
Figure 2E:
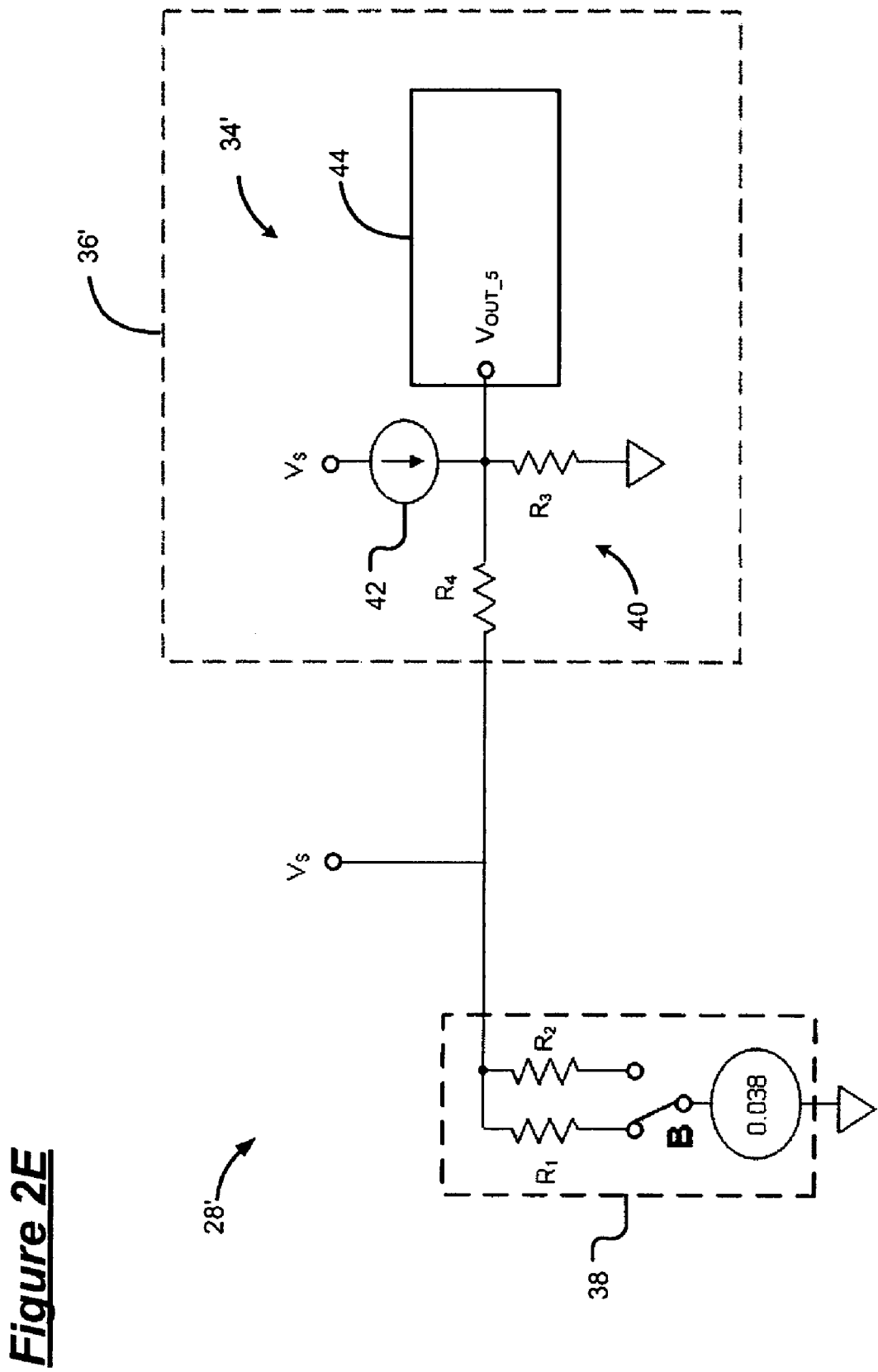
Figure 3A:
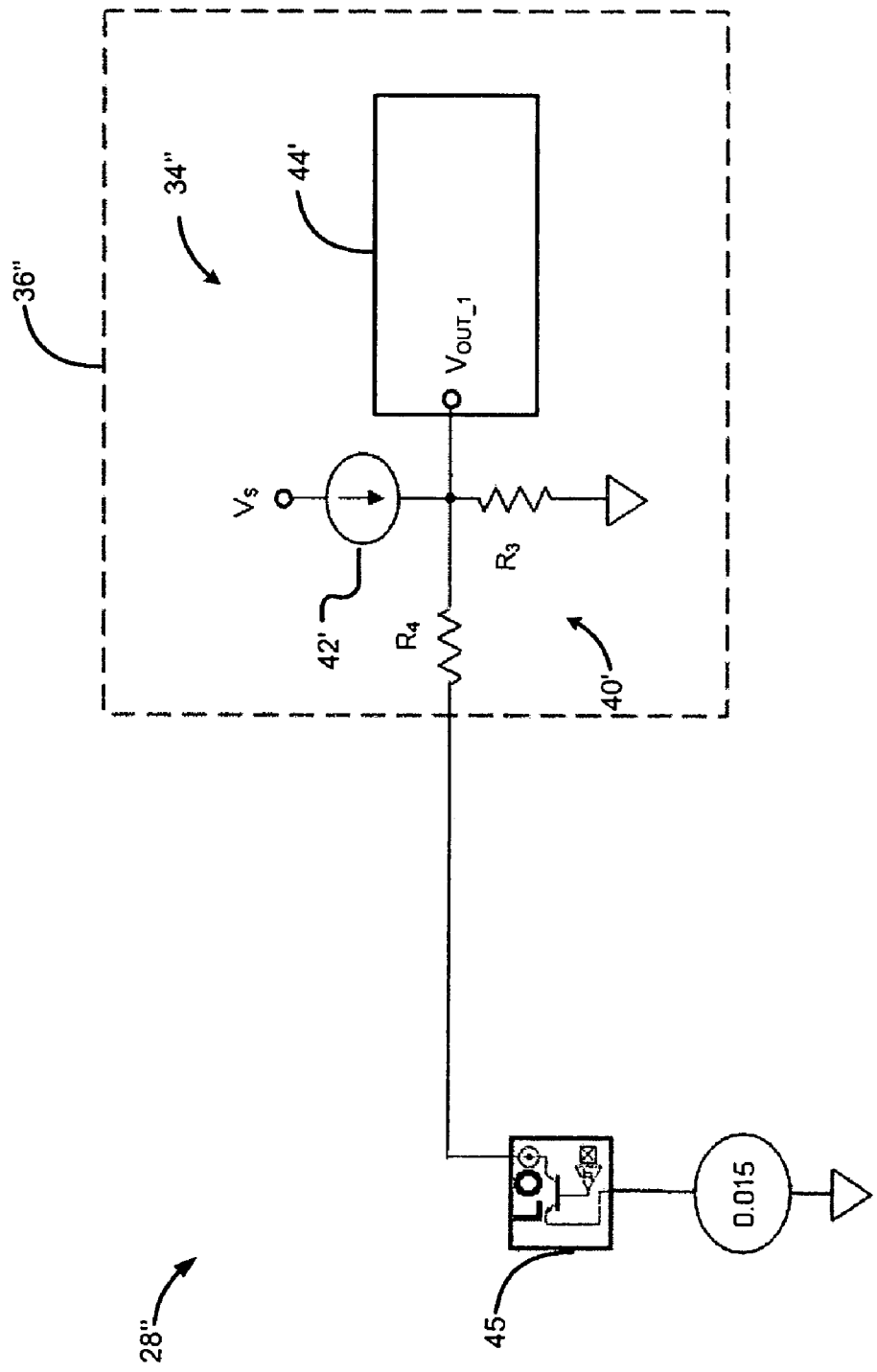
FIGS. 3A, 3B, 3C, 3D and 3E are circuit diagrams of an alternative switch system according to the present invention.
Figure 3B:
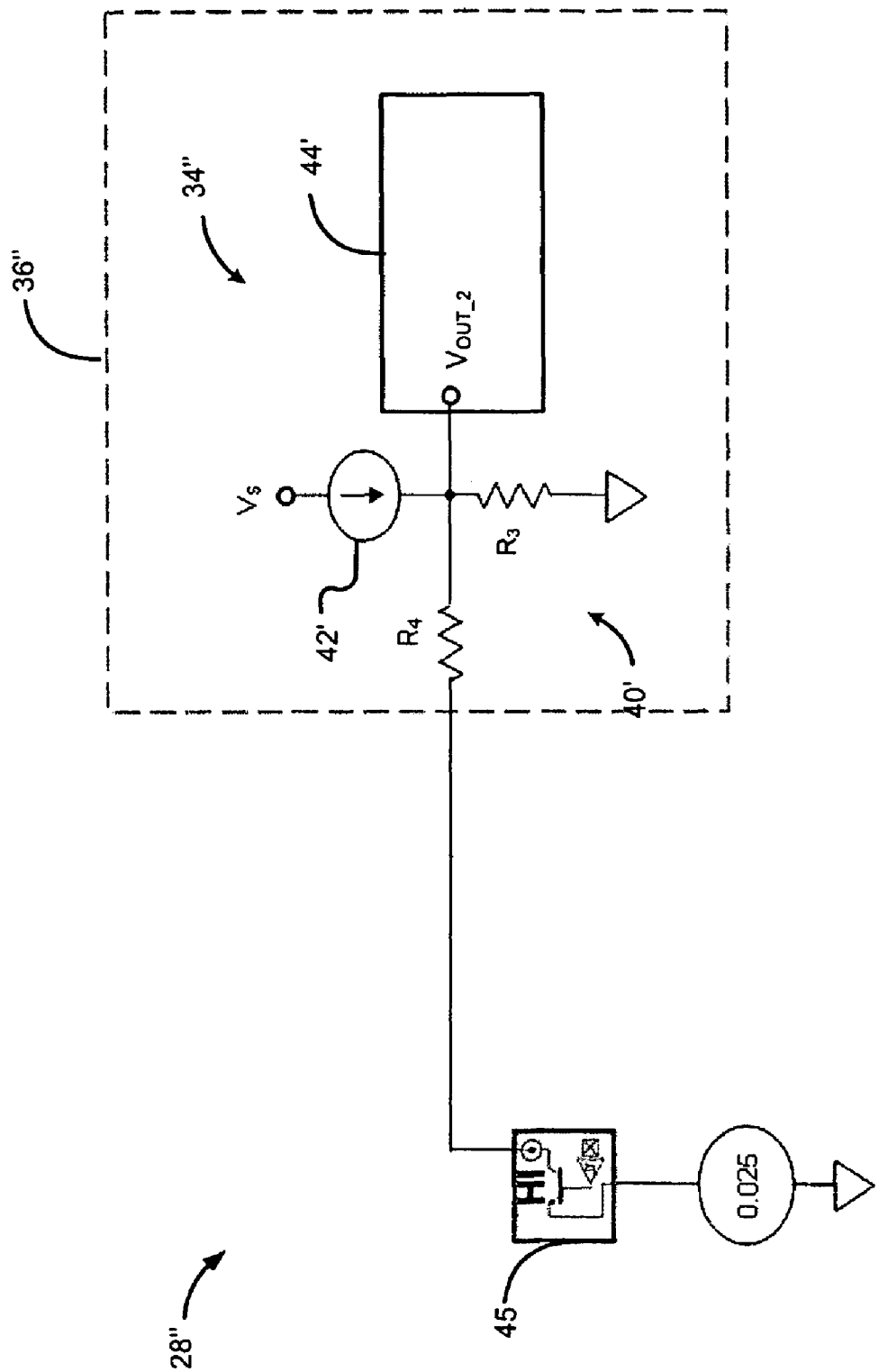
Figure 3C:
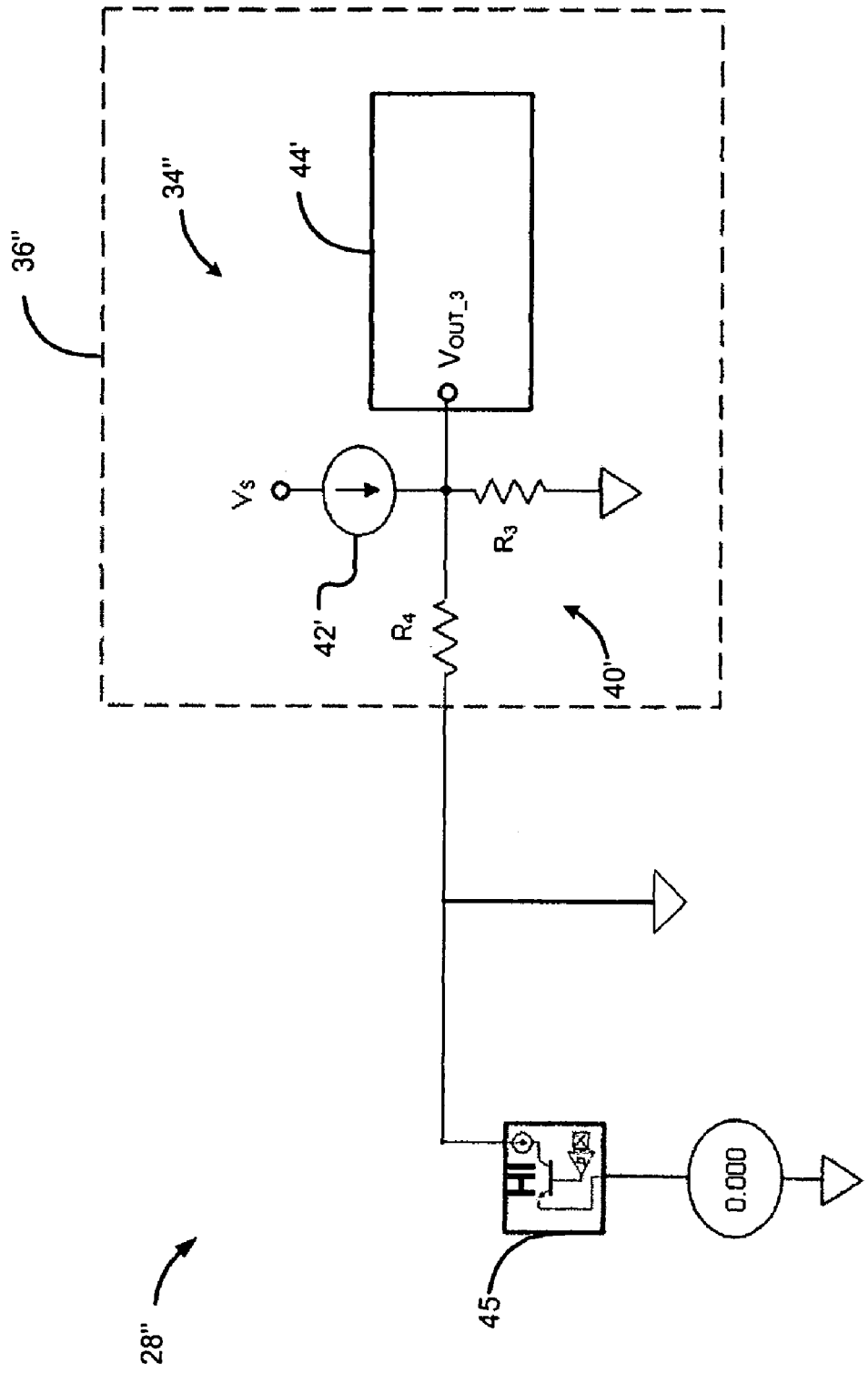
Figure 3D:
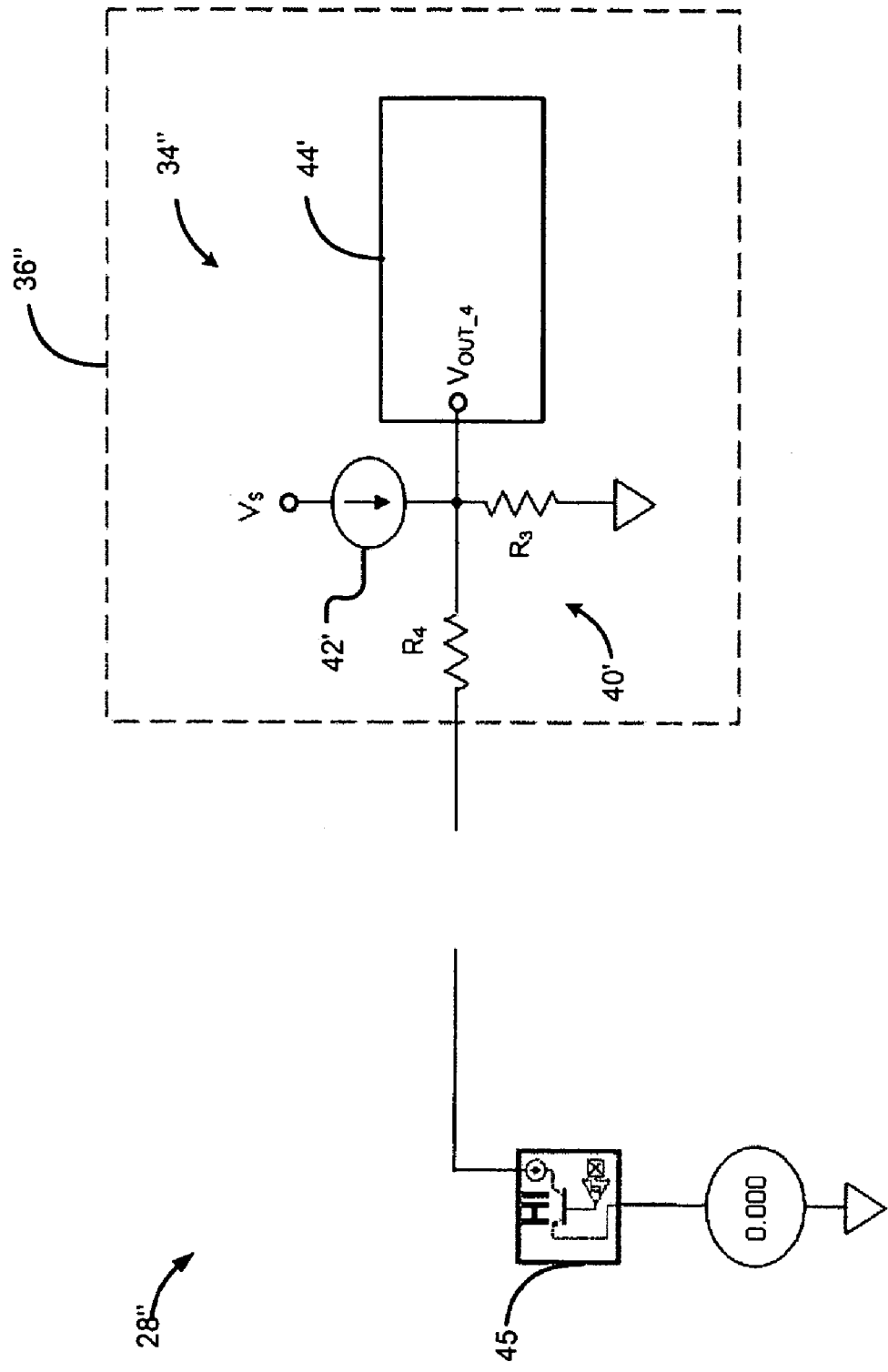
Figure 3E:
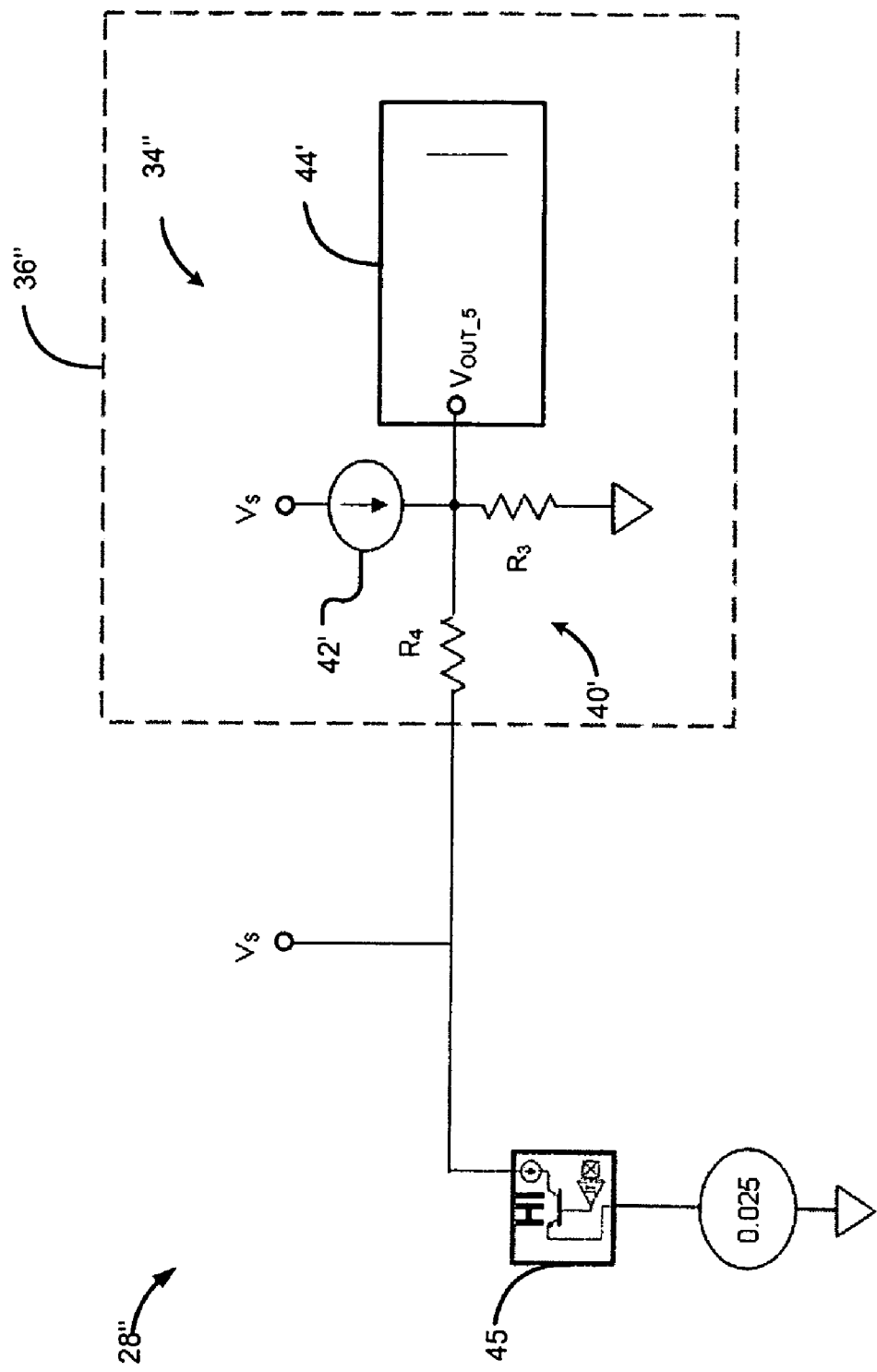

POSITION B disconnects R2 and connects R1 to ground (FIG. 2B). Accordingly, current is conducted through R3, R4 and R1 and $V_{OUT}$ can be expressed as:

$$V_{out} = \frac{I_C(R_4 + R_1)R_3}{R_1 + R_3 + R_4} \tag{2}$$

The switch system 28' can be designed to provide the predetermined voltage values that correspond to the operating modes of the double throw switch 38. For example, R1 and R2 can be set to 185 ohms and 754 ohms, respectively. R3 and R4 can be set to 286 ohms and 100 ohms, respectively. Accordingly, $V_{OUT}$ is approximately 3 volts when the double throw switch 38 is in POSITION A and no circuit faults exist in the circuit with $I_C$ at 0.014 ma. When the double position switch 38 is in POSITION B and no circuit faults exist, $V_{OUT}$ is approximately 2 volts.

Additionally, the switch system 28' can output voltages that correspond to the various circuit faults stated above. For example, when a short circuit to ground exists (FIG. 2C), current is conducted through R4, but not through R1 or R2. Accordingly, $V_{OUT}$ is approximately 1 volt. The voltage can be expressed as:

$$V_{out} = I_C \left( \frac{R_4 R_3}{R_4 + R_3} \right) \quad (3)$$

When an open circuit exists between R4 and the double throw switch 38 (FIG. 2D), no current flows through R4. The current through R3 creates $V_{OUT}$. Accordingly, $V_{OUT}$ is approximately 4 volts and $V_{OUT}$ can be expressed as:

$$V_{OUT} = I_C R_3. \quad (4)$$

When a short circuit to a voltage source exists (FIG. 2E), $V_{OUT}$ is approximately 6 volts and $V_{OUT}$ can be expressed as:

$$V_{out} = \left( I_C + \frac{V_S - I_C R_3}{R_4 + R_3} \right) R_3 \quad (5)$$

Note: Both formulas are valid.

$$V_{out} = \frac{V_S R_3 + I_C R_3 R_4}{R_3 + R_4}$$

The control module 36' can be programmed with one or more voltage value ranges that correspond to one or more electrical states of the control module input circuit 34' described above. The voltage ranges have an upper voltage value and a lower voltage value. For example, the control module 36' can be programmed to associate a first voltage value range $V_{NORM1}$ to a first normal condition and a second voltage value range $V_{OPEN}$ to an open circuit fault. The control module 36' compares $V_{OUT}$ to $V_{NORM1}$. When $V_{OUT}$ is within $V_{NORM1}$, the control module 36' determines that the switch system 28' is operating in the first normal condition. When $V_{OUT}$ is within $V_{OPEN}$, the control module 36' determines that an open circuit fault exists in the switch system 28'.

Referring now to FIGS. 3A-3E, an alternative exemplary switch system 28'' is shown. The double throw switch 38 is replaced with a Hall-effect switch 45 having a Hall-effect device 46 that can conduct current having different current strengths. When the Hall-effect switch 45 is in a first mode (LO mode), the Hall-effect device 46 can conduct a low strength current through R4. A low strength current includes a current strength of 2 mA to 5 mA. When the Hall-effect switch 45 is in a second mode (HIGH mode), the Hall-effect device 46 can conduct a high strength current through R4. A high strength current includes a current strength of 12 mA to 17 mA.

The current through R4 and R3 creates a voltage ($V_{OUT}$) that is converted to digital voltage value by the A/D converter 44 and is received by the control module 36''. Accordingly, the value of $V_{OUT}$ is based on the operating mode of the Hall-effect switch 45 and the electrical state of the circuit and the control module 36'' detects normal conditions and fault conditions in the same manner as stated above.

Figure 4A:
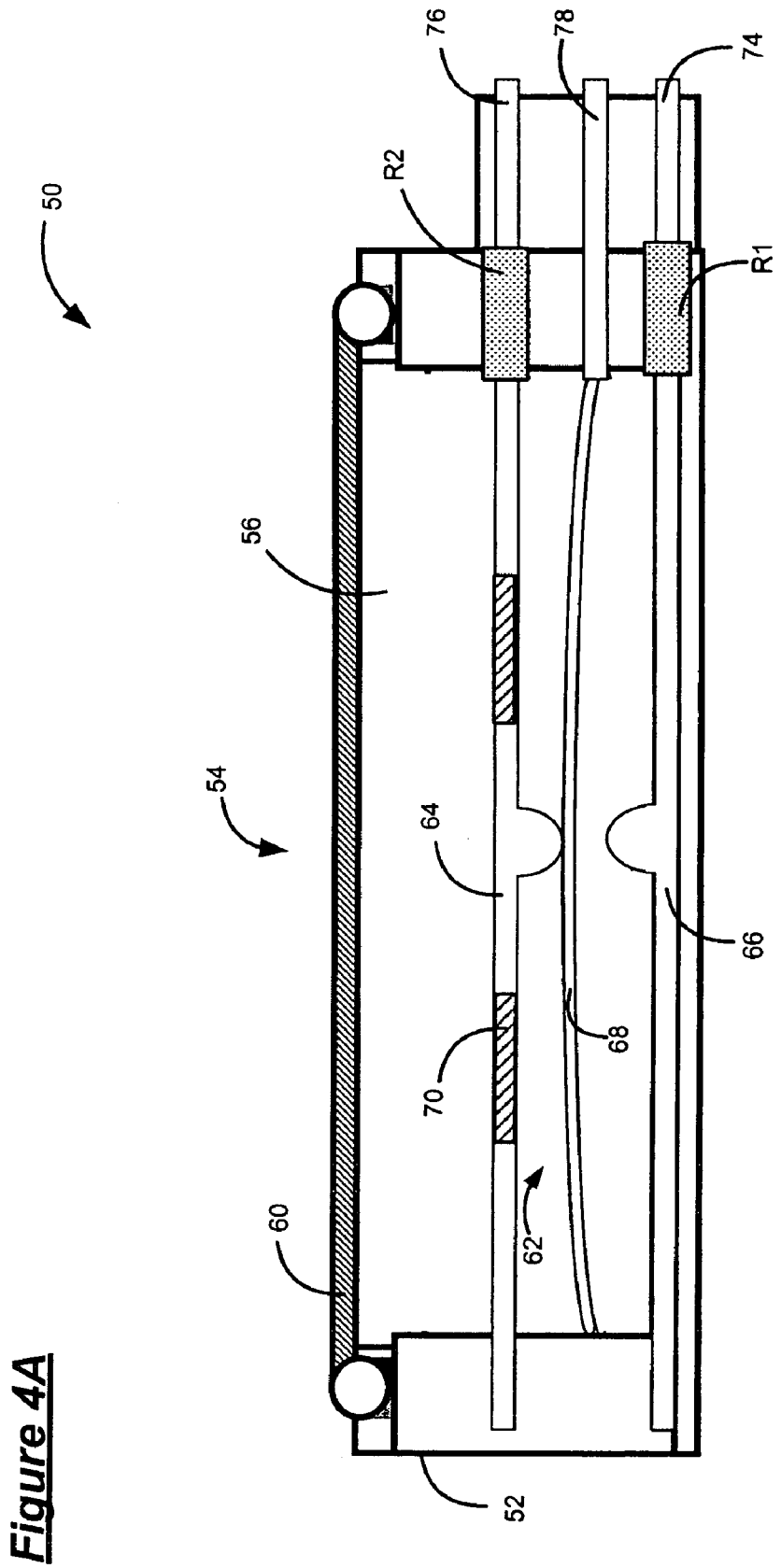
FIGS. 4A and 4B are block diagrams of a double throw pressure switch according to the present invention.
Figure 4B:
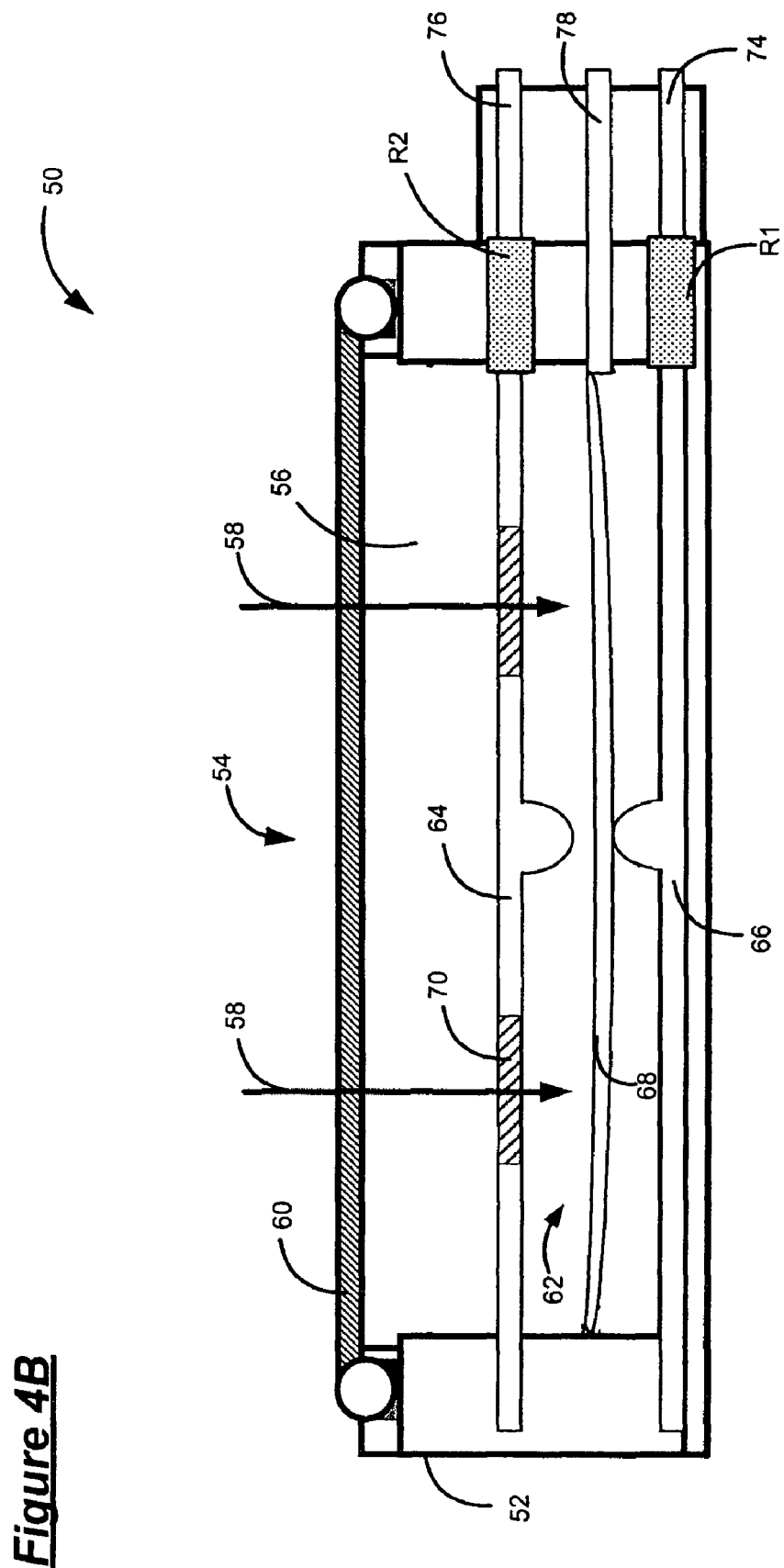

Referring now to FIGS. 4A and 4B, a cross-sectional illustration of an exemplary double throw switch 50 adapted to detect fluid pressure is shown. The double throw switch 50 includes a housing 52 having a top 54 and a pressure chamber 56 within the housing 52 that holds fluid 58. The top 54 couples to a fluid pressure source (not shown) and directs fluid 58 to the pressure chamber 56. A sealing device 60 is fixed to the housing 52 and surrounds the top 54 to prevent fluid 58 from escaping the double throw switch 50.

A switch assembly 62 is located in the pressure chamber 56. The switch assembly 62 includes an upper contact plate 64, a lower contact plate 66 and a moveable current conducting device, such as a flexible membrane 68. The upper and lower contact plates 64, 66 are made of an electrically conducting material, such as metal. The upper contact plate 64 is located approximately in the center of the pressure chamber 56 and is fixed to the inner sides of the housing 52. The upper contact plate 64 further has inlets 70 that allow fluid 58 to pass. The lower contact plate 66 is fixed to the bottom of the housing 52. The flexible electrically conducting membrane 68 is located between the upper and lower contact plates 64, 66. The sides of the membrane 68 are fixed to the inner walls of the housing 52. The membrane 68 is designed so that it communicates with the upper contact plate 64 when no fluid 58 exists in the pressure chamber 56.

Resistors R1 and R2 are located within the walls of the housing 52. One end of R1 and R2 communicates with the lower and upper contact plates 66, 64, respectively. The opposite end of R1 and R2 communicates with one end of a first and second terminal 74, 76 respectively. The opposite end of the first and second terminals 74, 76 extend to the exterior of the housing 52. Although it is shown that the value of R1 is different than the value of R2, it is appreciated that values of R1 and R2 can be equal. The double throw switch 50 further has a ground terminal 78 that has one end that communicates with the membrane 68 and has an opposite end that extends to the exterior of the housing 52. The first and second terminals 74, 76 typically communicate with electrical inputs from a circuit. The ground terminal 78 typically communicates with a ground source (ground).

Accordingly, the switch 50 exists in POSITION A (FIG. 4A) when the membrane 68 communicates with the upper contact plate 64. The switch 50 exists in POSITION B (FIG. 4B) when fluid pressure created by the fluid 58 moves the membrane 68 downward and the membrane 68 communicates with the lower contact plate 66.

Positions A and B can provide first and second current paths, respectively, when the switch 50 communicates with a circuit. Specifically, POSITION A, provides the first path where current enters the switch 50 through the first terminal 76 and flows through R2. The current continues traveling through the upper contact plate 64 where it communicates with the membrane 68. The current flows through the membrane 68 where it returns to ground through the ground terminal 78.

The double throw switch 50 operates in POSITION B when fluid 58 enters the switch 50 through the top 54 and is directed to the first contact plate 64. Specifically, fluid 58 passes through the inlets 70 and fills the pressure chamber 56. The increased fluid pressure caused by the fluid 58 moves the membrane 68 downward and into POSITION B. When operating in POSITION B, a second current path is selected and current enters the switch 50 through the second terminal 74 and flows through R1. The current continues traveling through the lower contact plate 66 where it communicates with the membrane 68. The current flows through the membrane 68 and returns to ground through the ground terminal 78.

Figure 5A:
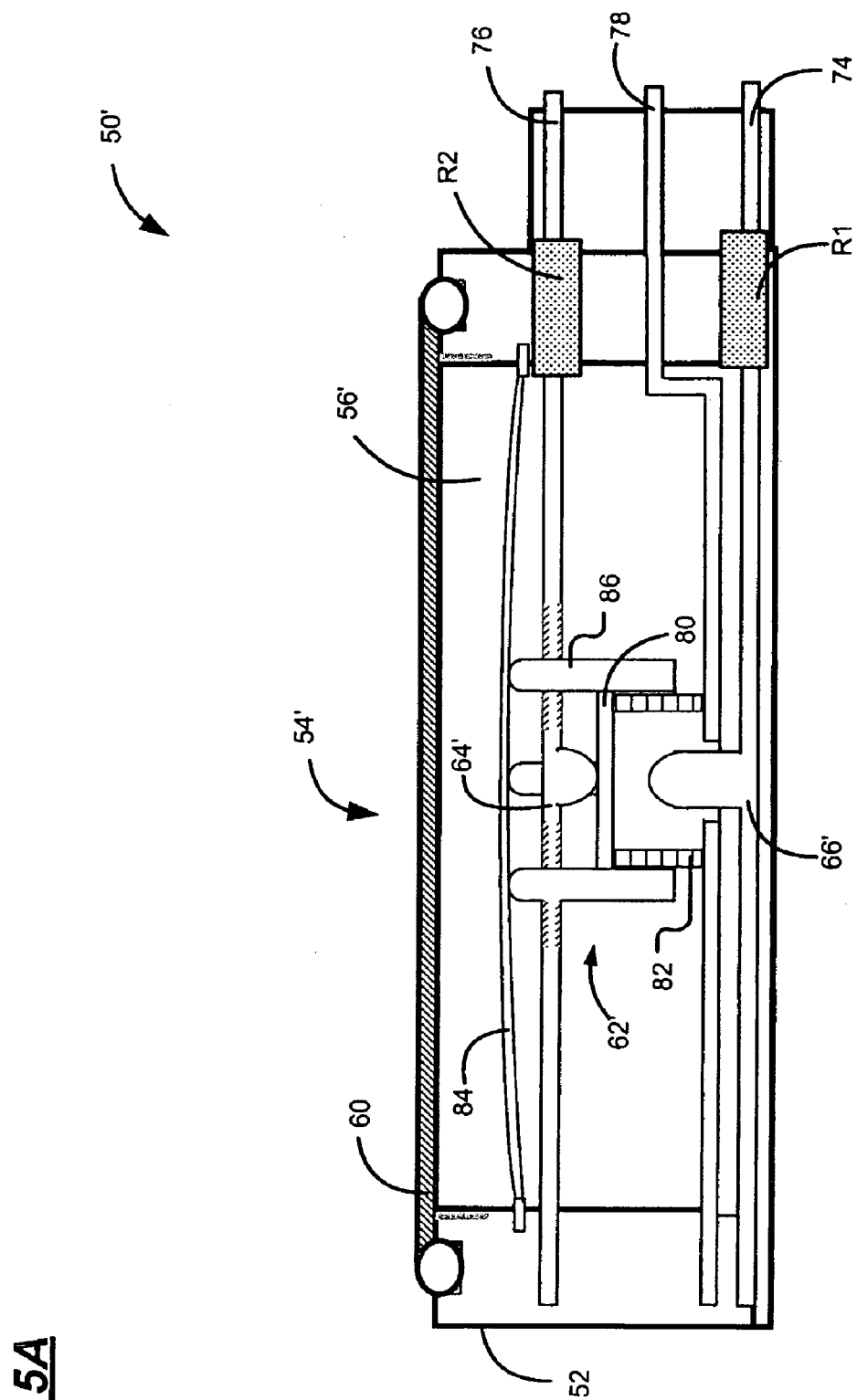
FIGS. 5A and 5B are block diagrams of an alternative double throw pressure switch according to the present invention.
Figure 5B:
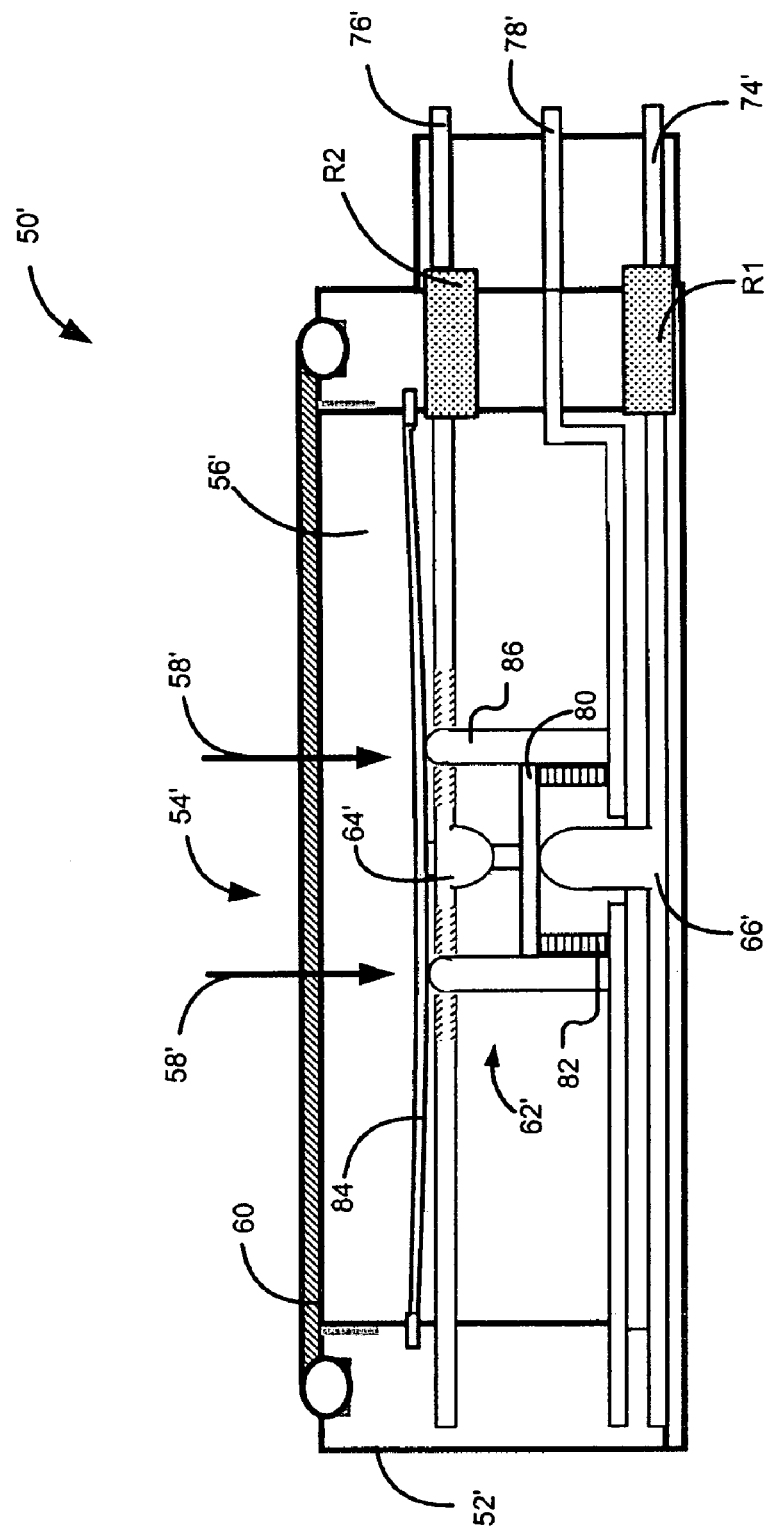

Referring now to FIGS. 5A and 5B, an alternative embodiment of a double throw switch 50' adapted to detect fluid pressure is illustrated., The double throw switch 50' is similar to the double throw switch 50 described in detail above. Therefore like reference numerals will be used to indicate like components. The switch assembly 62' includes a moveable electrically conductive actuator plate 80 that is located between the upper and lower contact plates 64', 66'. Electrically conductive springs 82 are coupled to opposite sides of the bottom of the actuator plate 80. The opposite end of the springs 82 is coupled to the lower contact plate 66'. The top of the actuator plate 80 is coupled to a membrane 84 using linking rod 86. The membrane 84 is adapted to receive fluid 58' and to deform based on an amount of fluid pressure.

When no fluid pressure exists in the pressure chamber 56', the springs 82 place the switch 50' in POSITION A by forcing the top of the actuator plate 80 against the upper contact plate 64'. When fluid 58' fills the pressure chamber 56', the switch 50' exists in POSITION B. The fluid pressure moves the membrane 84 downward. As a result, the switch 50' operates in POSITION B when fluid 58' fills the pressure chamber 56' and moves the membrane 84 downward. The bottom of the actuator plate 80 is forced against the lower contact plate 66'. The actuator plate 80 moves between first and second positions to provide first and second current paths, as discussed above.

Figure 6:
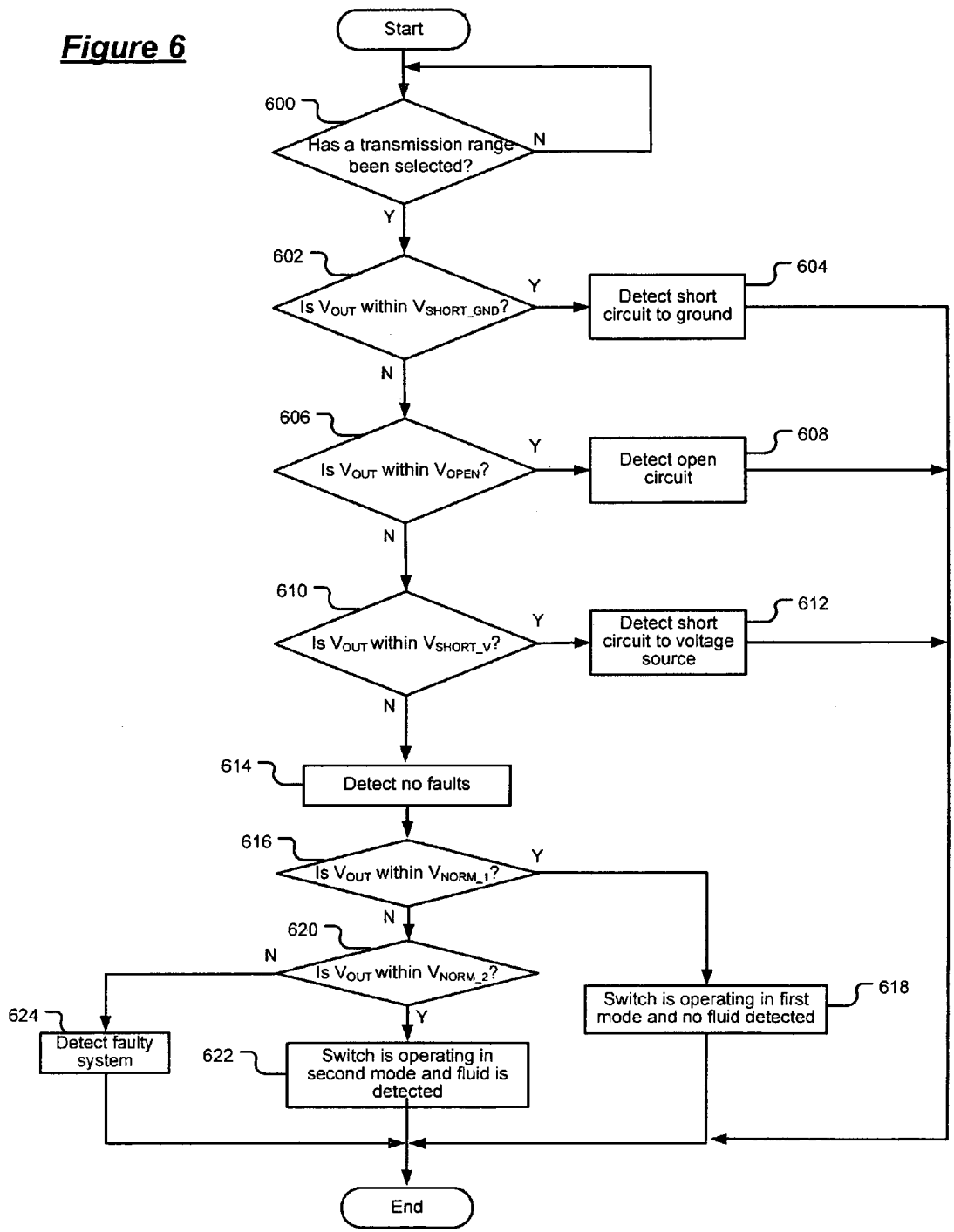
FIG. 6 is a flow chart illustrating steps executed by a switch system according to the present invention.

Referring now to FIG. 6, a flowchart illustrates the steps executed by the control system according to the present invention. In step 600, control determines whether a transmission range has been selected. When a transmission range has not been selected, control returns to step 600. Otherwise, control determines whether a short circuit to ground fault exists in step 602. When $V_{OUT}$ is within $V_{SHORT\_GND}$, control determines a short circuit to ground exists in step 604 and control ends. Otherwise, control determines whether an open circuit fault exists in step 606. When $V_{OUT}$ is within $V_{OPEN}$, control determines an open circuit fault exists in step 608 and control ends. Otherwise, control determines whether a short circuit to the voltage source exists in step 610. When $V_{OUT}$ is within $V_{SHORT\_V}$, control determines a short circuit to voltage exists in step 612 and control ends. Otherwise, control determines no faults exist in step 614 and control proceeds to step 616.

In step 616, control determines whether $V_{OUT}$ is within $V_{NORM\_1}$. When $V_{OUT}$ is within $V_{NORM\_1}$, control determines the switch 32 is operating in a first mode and no fluid is detected in step 618 and control ends. Otherwise, control determines whether $V_{OUT}$ is within $V_{NORM\_2}$ in step 620. When $V_{OUT}$ is within $V_{NORM\_2}$, control determines the switch 32 is operating a second mode and fluid is detected in step 622 and control ends. Otherwise, control determines a system failure in step 624 and control ends.

Figure 7:
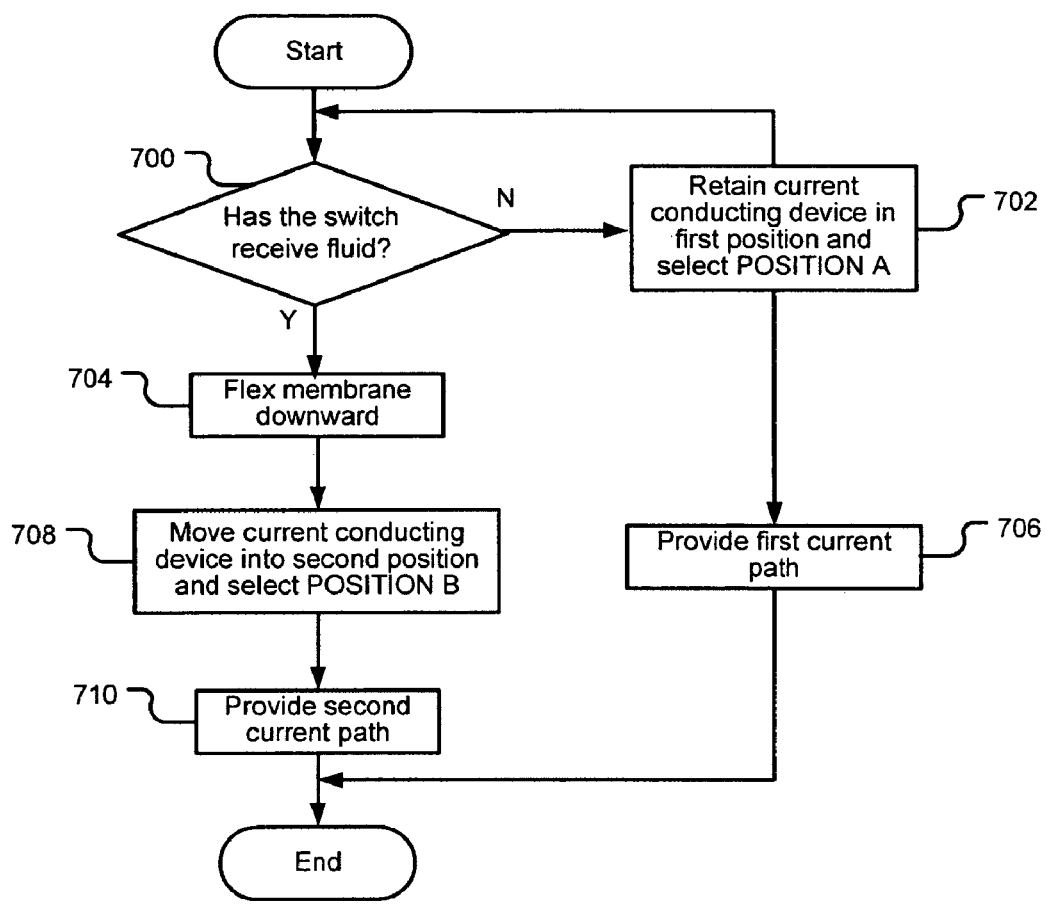
FIG. 7 is a flow chart illustrating steps executed by a double throw switch adapted to detect pressure according to the present invention.

Referring now to FIG. 7, a flowchart illustrates steps executed by a double throw pressure switch adapted to detect fluid pressure according to the principles of the present invention. In step 700, control determines whether the switch has received fluid. When the switch has received fluid, control proceeds to step 704. Otherwise control proceeds to step 702. In step 702, control retains a current conducting device in a first position and selects a LO mode. In step 706, control provides a first current path and control ends.

In step 704, control receives a fluid and fluid pressure moves a fluid detection device downward. In step 708, control moves the current conducting device to a second position and selects a HIGH mode. Control provides a second current path in step 710 and control ends.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A switch system comprising:
a detection device that operates in first and second modes and that conducts first and second currents based on said first and second modes, respectively;
a control module input circuit that outputs first and second voltages based on said first and second currents; and
a control module that receives said first and second voltages, that compares said first and second voltages to first and second predetermined voltage ranges, respectively, and that detects at least one of a proper operation and a faulty operation of the switch system based on said comparison,
wherein said control module receives said first voltage when said detection device conducts said first current and receives said second voltage when said detection device conducts said second current.

2. The switch system of claim 1 wherein:
said control module receives a third voltage when said control module input circuit has a first electrical fault,
said control module receives a fourth voltage when said control module input circuit has a second electrical fault, and
said control module receives a fifth voltage when said control module input circuit has a third electrical fault.

3. The switch system of claim 1 wherein said proper operation includes detecting one of said first and second modes.

4. The switch system of claim 2 wherein said faulty operation includes detecting at least one of said first, second and third electrical faults.

5. The switch system of claim 3 wherein:
said control module detects said first mode when said first voltage is within a first predetermined voltage range, and
said control module detects said second mode when said second voltage is within a second predetermined voltage range.

6. The switch system of claim 4 wherein:
said control module detects said first electrical fault when said third voltage is within a third predetermined voltage range,
said control module detects said second electrical fault when said fourth voltage is within a fourth predetermined voltage range, and
said control module detects said third electrical fault when said fifth voltage is within a fifth predetermined voltage range.

7. The switch system of claim 1 wherein said detection device is a double throw switch including two resistances having ends that communicate with said control module input circuit and having an opposite ends selectable by said double throw switch based on said first and second modes,
wherein said first mode selects said first resistance and said second mode selects said second resistance.

8. The switch system of claim 1 wherein said detection device is a Hall-effect switch having a Hall-effect device that communicates with said control module input circuit, that conducts a current having a first strength based on said first mode and that conducts said current having a second strength based on said second mode,
  wherein said first mode conducts said first current having said first strength and said second mode conducts said current having said second strength.

9. The switch system of claim 8 wherein:
said control module determines said Hall-effect switch is in said first mode when said first voltage is within a first predetermined voltage range, and
said control module determines said Hall-effect switch is in said second mode when said second voltage is within a second predetermined voltage range.

10. The switch system of claim 1 wherein said input circuit further comprises:
  an analog-to-digital (A/D) converter having an input and that outputs said voltage to said control module;
  a voltage stabilizing device having an end that communicates with a voltage source and having an opposite end that communicates with said input of said A/D converter;
  a first resistance having an end that communicates with a ground source and having an opposite end that communicates with said input of said A/D converter; and
  a second resistance having an end that communicates with said input of said A/D converter and having an opposite end that communicates with said detection device.

11. A method of detecting a fault in a switch system comprising:
  operating a detection device in first and second modes;
  conducting first and second currents based on said first and second modes, respectively;
  outputting first and second voltages based on said first and second currents;
  receiving said first and second voltages when said first and second currents are conducted, respectively;
  comparing said first and second voltages to first and second predetermined voltage ranges, respectively; and
  detecting at least one of a proper operation and a faulty operation of the switch system based on said comparison.

12. The method of claim 11 further comprising:
  receiving a third voltage when a control module input circuit has a first electrical fault,
  receiving a fourth voltage when said control module input circuit has a second electrical fault, and
  receiving a fifth voltage when said control module input circuit has a third electrical fault.

13. The method of claim 11 further comprising detecting said proper operation based on one of said first and second modes.

14. The method of claim 12 further comprising detecting said faulty operation includes based on at least one of said first, second and third electrical faults.

15. The method of claim 13 further comprising:
  detecting said first mode when said first voltage is within a first predetermined voltage range, and
  detecting said second mode when said second voltage is within a second predetermined voltage range.

16. The method of claim 14 further comprising:
  detecting said first electrical fault when said third voltage is within a third predetermined voltage range,
  detecting said second electrical fault when said fourth voltage is within a fourth predetermined voltage range, and
  detecting said third electrical fault when said fifth voltage is within a fifth predetermined voltage range.

17. The switch system of claim 1, wherein said control module input circuit is external from said control module.

18. The switch system of claim 1, wherein said control module input circuit is integrated in said control module.

* * * * *